US010181855B2

(12) United States Patent
Jensen et al.

(10) Patent No.: US 10,181,855 B2
(45) Date of Patent: Jan. 15, 2019

(54) INTEGRATED CIRCUIT COMPRISING ADJUSTABLE BACK BIASING OF ONE OR MORE LOGIC CIRCUIT REGIONS

(71) Applicant: GN Hearing A/S, Bellerup (DK)

(72) Inventors: Dan Raun Jensen, Hellerup (DK); Per Asbeck, Kobenhavn S (DK); Frederic Hasbani, Kobenhavn SV (DK)

(73) Assignee: GN Hearing A/S, Ballerup (DK)

( * ) Notice: Subject to any disclaimer, the term of this patent is extended or adjusted under 35 U.S.C. 154(b) by 0 days.

(21) Appl. No.: 15/676,907

(22) Filed: Aug. 14, 2017

(65) Prior Publication Data

US 2018/0183440 A1 Jun. 28, 2018

(30) Foreign Application Priority Data

Dec. 27, 2016 (EP) .................................... 16206966

(51) Int. Cl.
*H03K 19/00* (2006.01)
*H03K 19/0948* (2006.01)
*H03K 3/2885* (2006.01)
*H01L 27/092* (2006.01)
*H01L 27/12* (2006.01)
(Continued)

(52) U.S. Cl.
CPC ........... *H03K 19/0948* (2013.01); *G06F 1/06* (2013.01); *G06F 1/10* (2013.01); *G06F 1/3237* (2013.01); *H01L 27/092* (2013.01); *H01L 27/1203* (2013.01); *H03K 3/2885* (2013.01); *H03K 19/0016* (2013.01)

(58) Field of Classification Search
CPC . H01L 27/092; H01L 27/1203; H03K 3/2885; H03K 19/0016; H03K 19/0948
See application file for complete search history.

(56) References Cited

U.S. PATENT DOCUMENTS 5,461,338 A * 10/1995 Hirayama ............... G05F 3/205
327/534
5,610,533 A 3/1997 Arimoto et al.
(Continued)

OTHER PUBLICATIONS

Partial European Search Report dated Jun. 13, 2017 for corresponding EP Patent Application No. 16206966.0, 19 pages.
(Continued)

*Primary Examiner* — Alexander H Taningco
*Assistant Examiner* — Kurtis R Bahr
(74) *Attorney, Agent, or Firm* — Vista IP Law Group, LLP

(57) ABSTRACT

An integrated circuit includes a first logic circuit region comprising a first regional clock network for supplying a first regional clock signal to digital logic circuit(s); and a clock gating circuit to derive the first regional clock signal from a clock signal and selectively apply and interrupt the first regional clock signal in accordance with a state select signal. The first logic circuit region comprises a first back bias voltage grid connected to respective bodies of PMOS transistors of the digital logic circuit(s) and a second back bias voltage grid connected to respective bodies of NMOS transistors of the digital logic circuit(s). The integrated circuit further comprises a controllable back bias voltage generator configured to adjust a first back bias voltage of the first back bias voltage grid, and to adjust a back bias voltage of the second back bias voltage grid, in accordance with the state select signal.

30 Claims, 4 Drawing Sheets

(51) Int. Cl.
*G06F 1/32* (2006.01)
*G06F 1/06* (2006.01)
*G06F 1/10* (2006.01)

(56) References Cited

U.S. PATENT DOCUMENTS

| | | | | |
|---|---|---|---|---|
| 5,838,047 | A * | 11/1998 | Yamauchi | H01L 27/0218 257/372 |
| 6,031,778 | A * | 2/2000 | Makino | G11C 7/00 327/530 |
| 6,097,113 | A * | 8/2000 | Teraoka | H01L 27/092 257/E27.062 |
| 6,100,567 | A * | 8/2000 | Burr | H01L 29/78648 257/347 |
| 6,140,686 | A | 10/2000 | Mizuno et al. | |
| 6,466,077 | B1 | 10/2002 | Miyazaki et al. | |
| 6,630,857 | B2 * | 10/2003 | Mizuno | H03K 19/0016 327/391 |
| 7,330,049 | B2 * | 2/2008 | Perisetty | H01L 27/0921 257/E27.063 |
| 9,251,866 | B2 * | 2/2016 | Chun | G11O 5/146 |
| 9,312,834 | B1 * | 4/2016 | Parnami | H03K 3/012 |
| 9,337,826 | B2 * | 5/2016 | Koyama | H03K 17/302 |
| 2005/0015252 | A1 | 1/2005 | Marumoto | |
| 2007/0024318 | A1 * | 2/2007 | Mamidipaka | H03K 19/0016 326/38 |
| 2008/0143423 | A1 | 1/2008 | Komatsu et al. | |
| 2010/0033229 | A1 * | 2/2010 | Irie | H03K 19/0016 327/365 |
| 2012/0151226 | A1 | 6/2012 | Gaskins | |
| 2014/0145773 | A1 * | 5/2014 | Hashimoto | H03K 3/012 327/218 |
| 2015/0236583 | A1 * | 8/2015 | Ripley | H02M 3/06 323/234 |

OTHER PUBLICATIONS

Extended European Search Report dated Sep. 28, 2017 for corresponding EP Patent Application No. 16206966.0, 22 pages.

* cited by examiner

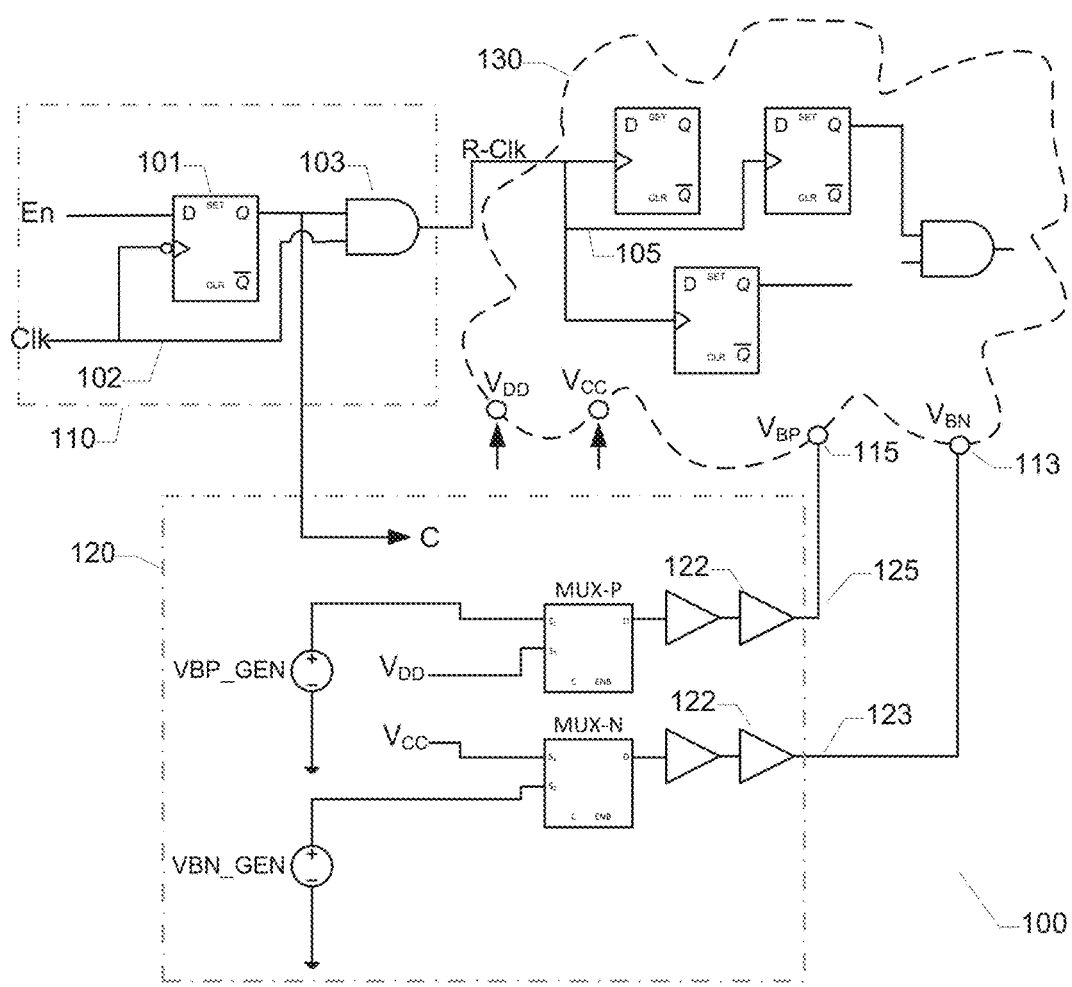
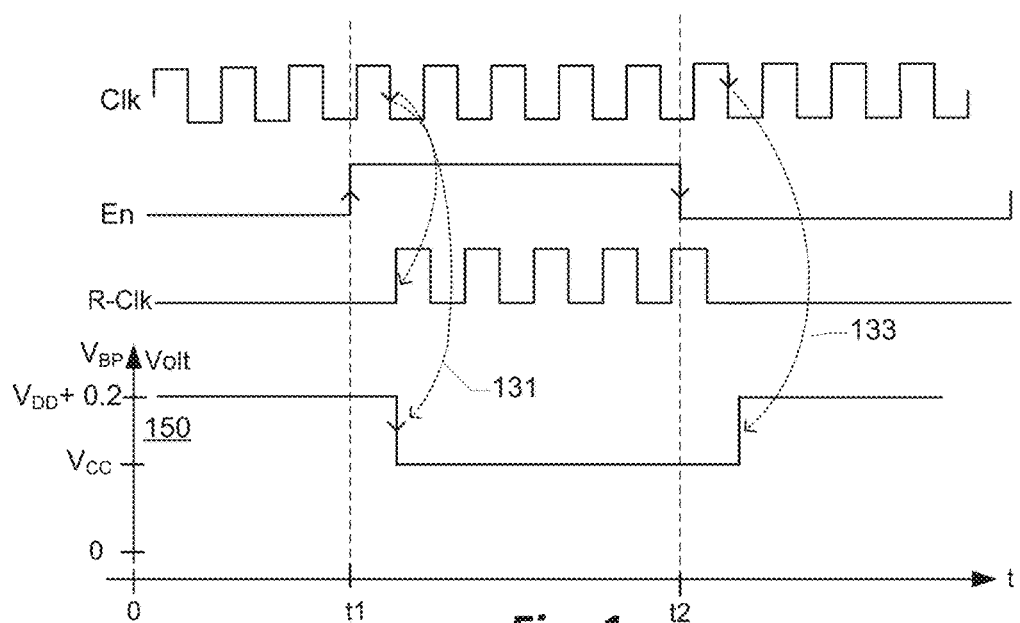
Fig. 1

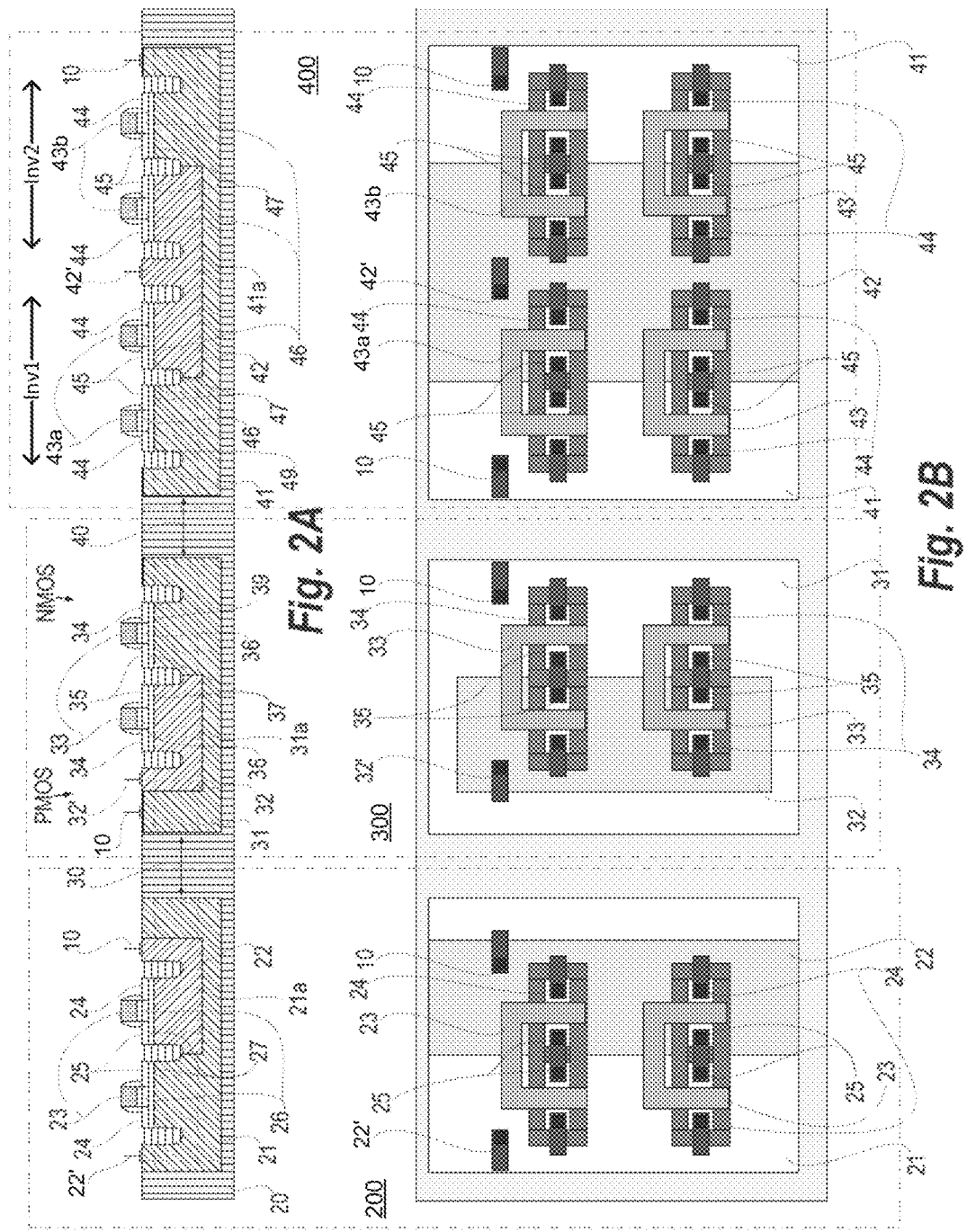

1

INTEGRATED CIRCUIT COMPRISING ADJUSTABLE BACK BIASING OF ONE OR MORE LOGIC CIRCUIT REGIONS

RELATED APPLICATION DATA

This application claims priority to, and the benefit of, European Patent Application No. 16206966.0, filed on Dec. 27, 2016, pending. The entire disclosure of the above application is expressly incorporated by reference herein.

FIELD

The present disclosure relates to an integrated semiconductor circuit comprising a first logic circuit region comprising a first regional clock network for supplying a first regional clock signal to one or more digital logic circuits of the first logic circuit region. The integrated semiconductor circuit further comprises a clock gating circuit configured to derive the first regional clock signal from a clock signal and selectively apply and interrupt the first regional clock signal in accordance with a state select signal of the first logic circuit region. The first logic circuit region comprises a first back bias voltage grid connected to respective bodies of PMOS transistors of the one or more digital logic circuits and a second back bias voltage grid connected to respective bodies of NMOS transistors of the one or more digital logic circuit(s). The integrated semiconductor circuit further comprises a controllable back bias voltage generator configured to adjust a back bias voltage of the first back bias voltage grid between a first level and a second level in accordance with the state select signal; and adjust a back bias voltage of the second back bias voltage grid between a first level and a second level in accordance with the state select signal.

BACKGROUND

Digital logic circuitry such as sequential logic circuits and combinatorial logic circuits implemented in contemporary integrated circuit short-scale CMOS processes suffers from leakage power losses. It is known to achieve power savings in such digital logic circuitry by utilizing so-called clock-gating mechanisms which save dynamic or switching power by preventing toggling regional clock signals of inactive circuit regions and leaf flip-flops.

Unfortunately, the digital logic circuitry of an inactive logic circuit region may still consume a relatively large amount of power due to respective leakage currents of the NMOS and PMOS transistors of digital logic circuits within the logic circuit region operated or controlled by the clock gating circuit. This leakage current is generally a growing problem with shrinking feature sizes of CMOS processes. The growing leakage current of NMOS and PMOS transistors is caused by subthreshold conduction and reverse biased diode leakage. This problem is particularly pronounced for digital logic circuitry operating at relatively low clock frequencies—for example with a clock frequency of less than 50 MHz or 25 MHz. The leakage power may exceed the dynamic power in certain digital logic circuitry operating at such relatively low clock frequencies. Integrated circuits for hearing instruments are one type of application where digital logic circuitry may be operating at these relatively low clock frequencies due to the extremely limited energy storage of conventional hearing instrument batteries.

SUMMARY

It would be desirable to have improved power saving mechanisms for digital logic circuitry, in particular digital logic circuitry operating at relatively low clock frequencies as discussed above.

A first aspect relates to an integrated semiconductor circuit comprising a clock signal grid for distributing a clock signal to one or more logic circuit regions and a first logic circuit region powered by a positive DC supply voltage and a negative DC supply voltage. The first logic circuit region comprising:

a first regional clock network for supplying a first regional clock signal to one or more digital logic circuits of the first logic circuit region, a clock gating circuit configured to derive the first regional clock signal from the clock signal and selectively apply and interrupt the first regional clock signal in accordance with a state select signal of the first logic circuit region, a first back bias voltage grid connected to respective bodies of PMOS transistors of the one or more digital logic circuits and a second back bias voltage grid connected to respective bodies of NMOS transistors of the one or more digital logic circuits, a controllable back bias voltage generator configured to:

adjust a back bias voltage of the first back bias voltage grid between a first level and a second level in accordance with the state select signal; and adjust a back bias voltage of the second back bias voltage grid between a first level and a second level in accordance with the state select signal.

The state select signal is configured to switch the first logic circuit region between an active state where the first regional clock signal is active and an inactive state where the first regional clock signal is interrupted or non-switching. The present integrated semiconductor circuit exploits the state select signal to determine the bias voltage of the first back bias voltage grid and the bias voltage of the second back bias voltage grid. Thereby, the state select signal may for example be used to set the voltage of the first back bias voltage grid to the positive DC supply voltage, e.g. the first level of the back bias voltage or bias voltage, when the first logic circuit region resides in an active state where the first regional clock signal is switching. This back bias voltage setting may provide maximum speed of the one or more digital logic circuits of the first logic circuit region albeit with a relatively high amount of leakage current. The state select signal may be used to set the voltage of the first back bias voltage grid to a bias voltage higher than the positive DC supply voltage, e.g. the second level, when the first logic circuit region resides in an inactive state where the first regional clock signal is interrupted by the clock gating circuit. This second level of the back bias voltage setting may significantly reduce leakage current through PMOS transistors of the one or more digital logic circuits of the first logic circuit region. Consequently, this feature provides a marked reduction of leakage power in the first logic circuit region when the latter is an inactive state or sleeping. The state select signal may be used in a corresponding manner to set the voltage of the second back bias voltage grid to the negative DC supply voltage, e.g. the first level of the back bias voltage when the first logic circuit region resides in the above-mentioned active state. The state select signal may be used to set the voltage of the second back bias voltage grid to a bias voltage below the negative DC supply voltage, e.g. the second level, when the first logic circuit region resides in the inactive state. This second level of the back bias voltage setting may significantly reduce leakage current through NMOS transistors of the one or more digital logic circuits of the first logic circuit region.

The controllable back bias voltage generator may accordingly be configured to:
in the active state: adjust the back bias voltage of the first back bias voltage grid to the positive DC supply voltage, of the first logic circuit region, and adjust the back bias voltage or bias voltage of the second back bias voltage grid to the negative DC supply voltage; and
in the inactive state: adjust the back bias voltage of the first back bias voltage grid to a voltage above the positive DC supply voltage and adjust the back bias voltage or bias voltage of the second back bias voltage grid to a voltage below the negative DC supply voltage.

According to other embodiments of the integrated semiconductor circuit, the state select signal is utilized to set the voltage of the first back bias voltage grid to the positive DC supply voltage, e.g. the second level, when the first logic circuit region resides in the inactive state and set the voltage of the first back bias voltage grid to a bias voltage below the positive DC supply voltage, e.g. the first level, when the first logic circuit region resides in the active state. In the latter embodiment, the state select signal is utilized to set the voltage of the second back bias voltage grid to the negative DC supply voltage, e.g. the second level, when the first logic circuit region resides in the inactive state and set the voltage of the second back bias voltage grid to a bias voltage above the negative DC supply voltage, e.g. the first level, when the first logic circuit region resides in the active state Hence, the present integrated semiconductor circuit may combine an adjustable body-bias voltage of at least one of the PMOS and NMOS transistors of the one or more digital logic circuits of the first logic circuit region and clock-gating techniques to jointly provide a highly efficient methodology for reducing leakage power of the one or more digital logic circuits of the first logic circuit region e.g. in terms of circuit overhead and power overhead.

The second level of the first back bias voltage, for the PMOS transistors, may be at least 100 mV higher higher than the first level of the first back bias voltage. The second level of the second back bias voltage, for the NMOS transistors, may be at least 100 mV higher lower than the first level of the second back bias voltage. Hence, where the first level of the second back bias voltage corresponds to the negative DC supply voltage, e.g. ground, the second level of the second back bias voltage may lie below ground, e.g. minus 100 mV. Accordingly, one embodiment of the controllable back bias voltage generator may be configured to:
set a voltage difference between the first level and the second level of the first back bias voltage grid larger than 100 mV, more preferably at least 200 mV; and
set a voltage difference between the first level and the second level of the second back bias voltage grid larger than 100 mV, more preferably at least 200 mV.

The one or more digital logic circuit(s) preferably comprise(s) at least one sequential logic circuit, such as a flip-flop, connected to the first regional clock network for receipt of the first regional clock signal. The skilled person will understand the first logic circuit region may comprise between 1 and 5000 individual logic circuits such as between 10 and 2000 individual logic circuits. The individual logic circuits may comprise a plurality of sequential logic circuits connected to the first regional clock network and additionally plurality of combinational logic circuits such as AND gates, OR gates etc.

The controllable back bias voltage generator may comprise:
a first multiplexer configured to selectively connect a first back bias voltage and the positive DC supply voltage to the first back bias voltage grid in accordance with the state select signal; and a second multiplexer configured to selectively connect the second back bias voltage and the negative DC supply voltage to the second back bias voltage grid in accordance with the state select signal. The first back bias voltage and the second back bias voltage may be generated remotely relative to the first logic circuit region and routed from this remote location on the integrated circuit to the controllable back bias voltage generator via suitable power line grids or wires. In the latter embodiment respective first and second back bias voltages for multiple individual logic circuits regions may be supplied from a shared voltage converter or converters. The voltage converter may comprise a linear voltage regulator or a switched mode DC-DC converter. The switched mode DC-DC converter may be configured to generate at least one of the first back bias voltage and the second back bias voltage from the positive DC supply voltage. According one such embodiment, the switched mode DC-DC converter may comprise a switched capacitor power converter which typically possesses a compact layout, i.e. small semiconductor die are, and high conversion efficiency.

The first multiplexer may comprise:
a first input connected to the first back bias voltage and a second input connected to the positive DC supply voltage,
a select input coupled to the state select signal,
an output connected to the first back bias voltage grid. The second multiplexer may likewise comprise:
a first input connected to the second back bias voltage and a second input connected to the negative DC supply voltage,
a select input coupled to the state select signal,
an output connected to the second back bias voltage grid.

One embodiment of the clock gating circuit comprises a D-FF (D-flip-flop) and an AND gate. The D-FF has a data input connected to the state select signal, a clock input connected to the clock signal and an output connect to a first input of the AND gate while a second input of the AND gate is connected to the clock signal such that the output of the AND gate supplies the first regional clock signal to the first regional clock network. The operation and merits of this embodiment are discussed in additional detail below with reference to the appended drawings.

The present integrated semiconductor circuit may be integrated in different types of CMOS technology for example fully depleted Silicon on Insulator (FD SOI) processes or partly depleted Silicon on Insulator (PD SOI) processes. These CMOS technologies allow significant voltage adjustments of the respective back bias voltages of the NMOS and PMOS transistors to control the respective threshold voltages of the NMOS and PMOS transistors across wide voltage ranges. Consequently, one embodiment of the integrated semiconductor circuit is arranged on, i.e. fabricated on, a fully depleted Silicon on Insulator (FD SOI) semiconductor substrate or a partially depleted Silicon on Insulator (PD SOI) semiconductor substrate. The fully or partially depleted Silicon on Insulator substrate may comprise a standard well structure; said standard well structure comprising;
- a plurality of N-wells comprising respective PMOS transistors of the one or more digital logic circuits, said plurality of N-wells being connected to the second back bias voltage grid for receipt of the second back bias voltage; and
- a plurality of P-wells comprising respective NMOS transistors of the one or more digital logic circuits, said plurality of P-wells being connected to the first back bias voltage grid for receipt of the first back bias voltage as discussed in additional detail below with reference to the appended drawings.

An alternative embodiment of the fully or partially depleted Silicon on Insulator substrate comprises a flip-well structure. The flip-well structure comprises:
- a plurality of N-wells comprising respective NMOS transistors of the one or more digital logic circuits, said plurality of N-wells being connected to the second back bias voltage grid for receipt of the second back bias voltage; and
- a plurality of P-wells comprising respective PMOS transistors of the one or more digital logic circuits, said plurality of P-wells being connected to the first back bias voltage grid for receipt of the first back bias voltage; and
- a plurality of deep n-well diffusions arranged respective ones of the plurality of P-wells as discussed in additional detail below with reference to the appended drawings.

Yet another embodiment of the present integrated semiconductor circuit is integrated on a bulk CMOS process using a double-well structure to support separately and flexibly adjustable back bias voltages for the PMOS transistors and NMOS transistors. Consequently, the integrated semiconductor circuit may comprise a bulk CMOS substrate comprising a double-well structure; said double-well structure comprising;
- a plurality of N-wells comprising respective NMOS transistors of the one or more digital logic circuits, said plurality of N-wells being connected to the second back bias voltage grid for receipt of the second back bias voltage; and
- a plurality of P-wells comprising respective PMOS transistors of the one or more digital logic circuits, said plurality of P-wells being connected to the first back bias voltage grid for receipt of the first back bias voltage; and
- a plurality of deep n-well diffusions arranged respective ones of the plurality of P-wells.

A second aspect relates to a method of controlling leakage current of one or more digital logic circuits of a first logic circuit region of an integrated semiconductor circuit, comprising:
- supplying a clock signal and a state select signal to a clock gating circuit,
- deriving a first regional clock signal for the first logic circuit region from the clock signal and the state select signal,
- applying the first regional clock signal to a regional clock network of the first logic circuit region in an active state of the first logic circuit region,
- interrupting the first regional clock signal in an inactive state of the first logic circuit region,
- supplying a back bias voltage to a first back bias voltage grid connected to bodies of a plurality of PMOS transistors of the one or more digital logic circuits,
- supplying a second back bias voltage to a second back bias voltage grid connected to bodies of NMOS transistors of the one or more digital logic circuits,
- adjusting the back bias voltage of the first back bias voltage grid between a first level and a second level in accordance with the state select signal,
- adjusting the back bias voltage of the first back bias voltage grid between a first level and a second level in accordance with the state select signal.

The skilled person will understand that the back bias voltage of the first back bias voltage grid may be adjusted according to any of the previously described mechanisms and/or the back bias voltage of the second back bias voltage grid may be adjusted according to any of the previously described mechanisms.

A third aspect relates to a hearing instrument comprising an integrated semiconductor circuit according to any of the above-described embodiments thereof. The integrated semiconductor circuit comprising a control and processing circuit which comprises:
a first audio input channel for receipt of a first audio signal,
a signal processor for receipt and processing of the first audio signal for generating a compensated microphone signal according to a hearing loss of a user;
an output amplifier for receipt of the compensated microphone signal and generation of an amplified or buffered output signal for application to a miniature receiver or loudspeaker of the hearing instrument.

The signal processor may comprise the previously discussed one or more logic circuit regions where each logic circuit region comprises a regional clock network for supplying a regional clock signal to each logic circuit region and an associated clock gating circuit configured to derive the regional clock signal from a master clock signal of the integrated circuit and selectively apply and interrupt each regional clock signal in accordance with a dedicated state select signal associated with the logic circuit region in question. Hence, each region of multiple logic circuit regions may be switched between its active state and inactive state by a dedicated state select signal.

The signal processor of the hearing instrument may comprise dedicated digital logic circuitry, a software programmable processor or any combination thereof. As used herein, the terms "processor", "signal processor", "controller", "system", etc., are intended to refer to microprocessor or CPU-related entities, either hardware, a combination of hardware and software, software, or software in execution. For example, a "processor", "signal processor", "controller", "system", etc., may be, but is not limited to being, a process running on a processor, a processor, an object, an executable file, a thread of execution, and/or a program. By way of illustration, the terms "processor", "signal processor", "controller", "system", etc., designate both an application running on a processor and a hardware processor. One or more "processors", "signal processors", "controllers", "systems" and the like, or any combination hereof, may reside within a process and/or thread of execution, and one or more "processors", "signal processors", "controllers", "systems", etc., or any combination hereof, may be localized on one hardware processor, possibly in combination with other hardware circuitry, and/or distributed between two or more hardware processors, possibly in combination with other hardware circuitry. Also, a processor (or similar terms) may be any component or any combination of components that is capable of performing signal processing. For examples, the signal processor may be an ASIC processor, a FPGA processor, a general purpose processor, a microprocessor, a circuit component, or an integrated circuit.

An integrated circuit includes: a clock signal grid for providing a clock signal; a first logic circuit region powered by a positive DC supply voltage and a negative DC supply voltage, wherein the first logic circuit region comprises a first regional clock network for supplying a first regional clock signal to one or more digital logic circuits of the first logic circuit region; a clock gating circuit configured to determine the first regional clock signal based on the clock signal, and selectively apply and interrupt the first regional clock signal in accordance with a state select signal of the first logic circuit region; a first back bias voltage grid connected to respective bodies of PMOS transistors of the one or more digital logic circuits; a second back bias voltage grid connected to respective bodies of NMOS transistors of the one or more digital logic circuits; and a controllable back bias voltage generator configured to (1) adjust a first back bias voltage of the first back bias voltage grid in accordance with the state select signal, and (2) adjust a second back bias voltage of the second back bias voltage grid in accordance with the state select signal.

Optionally, the one or more digital logic circuits comprise at least one sequential logic circuit connected to the first regional clock network for receipt of the first regional clock signal.

Optionally, the state select signal is for switching the first logic circuit region between an active state where the first regional clock signal is active, and an inactive state where the first regional clock signal is interrupted or non-switching.

Optionally, the controllable back bias voltage generator is configured to: in the active state: adjust the first bias voltage of the first back bias voltage grid to the positive DC supply voltage, and adjust the second bias voltage of the second back bias voltage grid to the negative DC supply voltage; and in the inactive state: adjust the first bias voltage of the first back bias voltage grid to a voltage above the positive DC supply voltage, and adjust the second bias voltage of the second back bias voltage grid to a voltage below the negative DC supply voltage.

Optionally, the controllable back bias voltage generator is configured to adjust the first back bias voltage between a first level and a second level.

Optionally, the controllable back bias voltage generator is configured to set a voltage difference between the first level and the second level of the first back bias voltage grid to be larger than 100 mV.

Optionally, the controllable back bias voltage generator is configured to adjust the second back bias voltage between a first level and a second level; and wherein the controllable back bias voltage generator is configured to set a voltage difference between the first level and the second level of the second back bias voltage grid larger than 100 mV.

Optionally, the controllable back bias voltage generator comprises: a first multiplexer configured to selectively provide the first back bias voltage and the positive DC supply voltage to the first back bias voltage grid in accordance with the state select signal; and a second multiplexer configured to selectively provide the second back bias voltage and the negative DC supply voltage to the second back bias voltage grid in accordance with the state select signal.

Optionally, the first multiplexer comprises: a first input for receiving the first back bias voltage, a second input for receiving the positive DC supply voltage, a select input for receiving the state select signal, and an output connected to the first back bias voltage grid; and wherein the second multiplexer comprises: a first input for receiving the second back bias voltage, a second input for receiving the negative DC supply voltage, a select input for receiving the state select signal, and an output connected to the second back bias voltage grid.

Optionally, the controllable back bias voltage generator comprises a switched mode DC-DC converter configured to generate at least one of the first back bias voltage and the second back bias voltage based on the positive DC supply voltage.

Optionally, the switched mode DC-DC converter comprises a switched capacitor converter.

Optionally, the clock gating circuit comprises a D-FF and an AND gate; wherein the D-FF has a data input configured to receive the state select signal, a clock input configured to receive the clock signal, and an output connected to a first input of the AND gate; and wherein a second input of the AND gate is configured to receive the clock signal, and an output of the AND gate is configured to provide the first regional clock signal to the first regional clock network.

Optionally, the integrated circuit is arranged on a fully depleted Silicon on Insulator (FD SOI) substrate or a partially depleted Silicon on Insulator (PD SOI) substrate.

Optionally, the fully or partially depleted Silicon on Insulator substrate comprises a well structure, the well structure comprising: a plurality of N-wells comprising the PMOS transistors of the one or more digital logic circuits, the plurality of N-wells being connected to the second back bias voltage grid for receipt of the second back bias voltage; and a plurality of P-wells comprising the NMOS transistors of the one or more digital logic circuits, the plurality of P-wells being connected to the first back bias voltage grid for receipt of the first back bias voltage.

Optionally, the fully or partially depleted Silicon on Insulator substrate comprises a flip-well structure, the flip-well structure comprising: a plurality of N-wells comprising the NMOS transistors of the one or more digital logic circuits, the plurality of N-wells being connected to the second back bias voltage grid for receipt of the second back bias voltage; and a plurality of P-wells comprising the PMOS transistors of the one or more digital logic circuits, the plurality of P-wells being connected to the first back bias voltage grid for receipt of the first back bias voltage.

Optionally, the integrated circuit further includes a bulk CMOS substrate comprising a double-well structure, the double-well structure comprising: a plurality of N-wells comprising the NMOS transistors of the one or more digital logic circuits, the plurality of N-wells being connected to the second back bias voltage grid for receipt of the second back bias voltage; and a plurality of P-wells comprising the PMOS transistors of the one or more digital logic circuits, the plurality of P-wells being connected to the first back bias voltage grid for receipt of the first back bias voltage.

Optionally, the first back bias voltage grid and the second back bias voltage grid are parts of the first logic circuit region.

A hearing instrument includes the integrated circuit; a first audio input channel for receipt of a first audio signal; a signal processor configured for processing the first audio signal to generate a compensated signal according to a hearing loss of a user; and an output amplifier for receipt of the compensated signal and generation of an amplified or buffered output signal for application to a receiver or loudspeaker of the hearing instrument.

A method of controlling leakage current of one or more digital logic circuits of a first logic circuit region of an integrated circuit, includes: supplying a clock signal and a state select signal to a clock gating circuit; deriving a first regional clock signal for the first logic circuit region from the clock signal and the state select signal; applying the first regional clock signal to a regional clock network of the first logic circuit region if the first logic circuit region is in an active state; interrupting the first regional clock signal if the first logic circuit region is in an inactive state; supplying a first back bias voltage to a first back bias voltage grid connected to bodies of a plurality of PMOS transistors of the one or more digital logic circuits; supplying a second back bias voltage to a second back bias voltage grid connected to bodies of NMOS transistors of the one or more digital logic circuits; adjusting the first back bias voltage in accordance with the state select signal; and adjusting the second back bias voltage in accordance with the state select signal.

Other features and advantageous will be described in the detailed description.

BRIEF DESCRIPTION OF THE DRAWINGS

Embodiments will be described in more detail in connection with the appended drawings, in which:

FIG. 1 shows a simplified schematic block diagram of an integrated circuit comprising at least one logic circuit region and its associated clock gating circuitry in accordance with a first embodiment;

FIGS. 2A and 2B show transistor layouts of an exemplary inverter circuit arranged within the at least one logic circuit region of the integrated circuit in three different fully depleted Silicon on Insulator (FD SOI) CMOS process technologies;

DETAILED DESCRIPTION

Figure 3A:
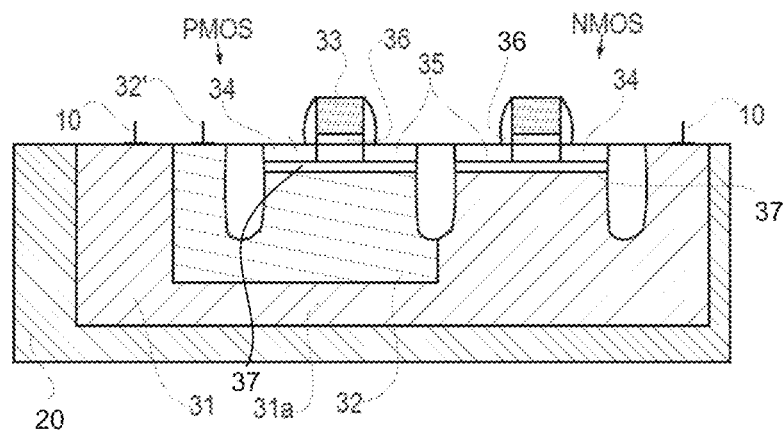
FIG. 3A and FIG. 3B show cut-through and top-view transistor layouts, respectively, of the exemplary inverter circuit integrated in a so-called flip-well FD SOI process.

In the following various exemplary embodiments of the present integrated circuit comprising one or several logic circuit regions controlled by respective regional clock signals and respective adjustable back bias voltages are described with reference to the appended drawings. It should be noted that elements of similar structures or functions are represented by like reference numerals throughout the figures. Like elements or components will therefore not necessarily be described in detail with respect to each figure. The skilled person will further appreciate that certain actions and/or steps may be described or depicted in a particular order of occurrence while those skilled in the art will understand that such specificity with respect to sequence is not actually required. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

FIG. 1 shows a simplified schematic block diagram of an integrated semiconductor circuit 100 comprising a logic circuit region 130, associated clock gating circuitry 110 and a controllable back bias voltage generator 120 all formed on a common a semiconductor substrate. The semiconductor substrate may comprise a fully depleted Silicon on Insulator (FD SOI) substrate or a partially depleted Silicon on Insulator (PD SOI) substrate. The skilled person will understand that the use of a FD SOI substrate or a PD SOI substrate is advantageous by leveraging on the high back-biasing voltage available to the applicable to bodies of NMOS and PMOS transistors in these semiconductor fabrication technologies and their strong impact on leakage current compared to standard CMOS bulk technology. However, alternative embodiments of the integrated semiconductor circuit may be fabricated in double-well bulk CMOS technology as discussed in additional detail below.

The integrated semiconductor circuit 100 comprises a clock signal grid 102 for distributing a clock signal Clk to the clock gating circuitry 110 and possibly to one or multiple additional logic circuit region(s) (not shown) of the integrated semiconductor circuit 100. Hence, for the sake of clarity the drawing illustrates merely a single logic circuit region 130, or clock-gated logic region 130, comprising a plurality of digital logic circuits. However, the skilled person will understand that the semiconductor substrate may comprise one or more clock gated logic circuit region(s) where each logic circuit region comprises a separate or dedicated regional clock network and regional clock signal controlling one or more digital logic circuits of the logic circuit region in question. The regional clock signal of each of the dedicated regional clock networks may be derived from the clock signal Clk in a corresponding manner as discussed below. Hence, the illustrated clock signal Clk may be a master clock signal of digital logic circuitry of the integrated circuit and therefore distributed across the semiconductor substrate to the one or more clock gated logic circuit region(s) via suitable clock grids or wires.

The clock gating circuit 110 is configured to derive a regional clock signal R-Clk from the master clock signal Clk and selectively apply and interrupt the regional clock signal R-Clk in accordance with a state select signal, En, provides to the logic circuit region .The state select signal En may be generated by a global clock controller of the circuit 100 configured to generate respective state select signals for the one or more clock gated logic circuit region(s) in accordance with a predetermined control scheme. The global clock controller may be configured to identify inactive logic circuit region(s) and interrupt the operation, i.e. clocking and state switching of such inactive regions to save power or energy of digital logic circuits within the inactive regions by interrupting the regional clock signal. The global clock controller may be implemented as a digital state machine.

The state select signal En is applied to a data input D of a flip-flop 101 while an inverted clock input of the D flip-flop is connected to the master clock signal Clk via the clock grid 102. Hence, when the logic state of the select signal (En) is "0", or logic low, the output Q of the D flip-flop 101 remains stationary at "0". On the other hand when the logic state of the select signal (En) switches to "1", or logic high, the output Q of the D flip-flop 101 in response switches to logic high at the next falling clock edge of the master clock signal. The output Q of the D flip-flop 101 is coupled to a first input of an AND gate 103 while a second input of the AND gate 103 is connected to the master clock signal via clock grid 102. An output of the AND gate 103 supplies the regional clock signal R-Clk to a first regional clock network 105 distributing R-Clk to various types of clocked logic of the digital logic circuits of the logic circuit region 130 such as flip-flops, registers, memory cells etc. Hence, the "and" operation performed by the AND gate 103 ensures that the regional clock signal R-Clk is switching, for example at the master clock frequency, in response to a logic high state of the state select signal En to define, or set, an active state of the logic circuit region(s) 130 which can be viewed as a clock gated logic circuit region 130 or domain. A logic low state of the state select signal En on the other hand interrupts the regional clock signal R-Clk to define or set an inactive state of the clock gated logic circuit region 130. The skilled person will understand that the illustrated coupling of a D flip-flop and an AND gate in the clock gating circuit 110 merely represent one specific example. Other embodiments of the clock gating circuit 110 may for example utilize pass-gate logic for deriving the regional clock signal R-Clk from the master clock signal Clk.

The digital logic circuits of the clock gated logic circuit region 130 are powered by a positive DC supply voltage $V_{DD}$ and a negative DC supply voltage $V_{CC}$. The negative DC supply voltage $V_{CC}$ may be ground potential of the integrated circuit 100 and the voltage of the positive DC supply voltage $V_{DD}$ may lie between 0.6 V and 1.2 V, in particular if the clock gated logic circuit region 130 is integrated on a short-scale CMOS semiconductor substrate targeted for hearing instrument applications. The clock gated logic circuit region 130 additionally comprises a first back bias voltage grid (not shown) connected to respective bodies of PMOS transistors of the digital logic circuits in the region 130 such as combinatorial logic circuits, flip-flops, registers, memory cells etc. The clock gated logic circuit region 130 additionally comprises a second back bias voltage grid (not shown) connected to respective bodies of NMOS transistors of the above-mentioned digital logic circuits in the region 130. The first back bias voltage grid is coupled to a first back bias input 115 of the region 130 for receipt of a first back bias voltage $V_{BP}$ supplied by the controllable back bias voltage generator 120. The second back bias voltage grid is coupled to a second back bias input 113 of the region 130 for receipt of a second back bias voltage $V_{BN}$ likewise supplied by the controllable back bias voltage generator 120. The controllable back bias voltage generator 120 generates the first back bias voltage and supplies the latter through a first output 125 which is connected to the first back bias input 115. The controllable back bias voltage generator 120 also generates the second back bias voltage and supplies the latter through a second output 123 which is connected to the first back bias input 115 of the logic region 130. The contacts points from the first back bias voltage grid to the individual PMOS transistors of the region 130 and the contacts points from the second back bias voltage grid to the individual NMOS transistors of the region 130 are discussed in further detail below with reference to a number of exemplary CMOS semiconductor process technologies.

The controllable back bias voltage generator 120 comprises a positive bias voltage generator VBP_GEN and a negative bias voltage generator VB_GEN. In some embodiments, each of the positive and negative bias voltage generators may comprise a linear voltage regulator or a switched mode DC-DC converter for example a switched capacitor DC-DC converter, configured to generate the first back bias voltage and the second back bias voltage from the positive DC supply voltage and/or from the negative DC supply voltage. The skilled person will understand that each of the positive bias voltage generator VBP_GEN and the negative bias voltage generator VB_GEN may be arranged locally adjacent to the clock gated logic circuit region 130 and clock gating circuitry 110 in some embodiments. Alternatively, each of the positive and negative bias voltage generators may be arranged on distant portions of the integrated circuit, for example at one of the previously discussed additional clock gated logic circuit region(s). In the latter situation, the first, e.g. positive, and second back bias voltages are routed from this distal location on the integrated circuit to the controllable back bias voltage generator 120 via suitable power line grids or wires. The skilled person will understand that numerous separate clock gated logic circuit regions of the integrated circuit can be provided with positive and second back bias voltages from shared positive and negative bias voltage generators, respectively. This reduces the total amount of voltage generator circuitry for supplying the positive and second back bias voltages in an advantageous manner.

The controllable back bias voltage generator 120 furthermore comprises a first multiplexer MUX-P and a second multiplexer MUX-N. A first input S1 of the first multiplexer MUX-P is connected to the first back bias voltage supplied by the positive bias voltage generator VBP_GEN. A second input S2 of MUX-P is connected to the positive DC supply voltage $V_{DD}$ and an output D of MUX-P is connected to the first output 125 of the generator 120 through one or more cascaded voltage followers or analog buffers 122. A first input S1 of the second multiplexer MUX-N is connected to the negative DC supply voltage $V_{CC}$. A second input S2 of MUX-N is connected to the the second back bias voltage supplied by the negative bias voltage generator VBN_GEN and an output D of MUX-N is connected to the second output 123 of the generator 120 through one or more voltage followers or analog buffers 122. The voltage follower(s) 122 are coupled to outputs of multiplexers MUX-N, MUX-P and dimensioned to drive the respective parasitic capacitances associated with the first back bias voltage grid and second back bias voltage grid of the logic region 130 with sufficient speed. Hence, the voltage follower(s) 122 coupled to MUX-P are preferably dimensioned to adjust the voltage of the first back bias voltage grid from the positive DC supply voltage $V_{DD}$ to the first back bias voltage or vice versa, in response to the logic region is switched from the active state to the inactive state or vice versa, in less than one clock cycle of the clock signal Clk. Likewise, the voltage follower(s) 122 coupled to MUX-N are preferably dimensioned to adjust the voltage of the second back bias voltage grid from the negative DC supply voltage $V_{CC}$ to the negative back voltage or vice versa, in response to the logic region 130 is switched from the active state to the inactive state or vice versa, in less than one clock cycle of the clock signal Clk. The skilled person will understand that the voltage follower(s) 122 therefore may be dimensioned to deliver a sufficiently high output current to charge and discharge the parasitic capacitances associated with the first back bias voltage grid and second back bias voltage grid within for example a single clock cycle. The magnitude of the parasitic capacitances of the first back bias voltage grid and second back bias voltage grid will naturally depend on the size of the logic region, in particular the number of digital logic circuits within the logic circuit region 130 and the specific CMOS semiconductor process of the integrated circuit. The number of digital logic circuits within any particular logic circuit region such as the logic circuit region 130 may for example vary between 1 and 5000 individual logic circuits such as between 10 and 2000 individual logic circuits.

The select input C of MUX-P and the select input C of MUX-N are both connected to the output Q of the D flip-flop 101. A logic state of the select input C of MUX-P therefore determines whether the first back bias voltage or the positive DC supply voltage $V_{DD}$ is routed to the output D of MUX-P and therefore applied to the first back bias input 115 of the region 130. Likewise, a logic state of the select input C of MUX-N determines whether the second back bias voltage or the negative DC supply voltage $V_{CC}$ is routed to the output D of MUX-N and therefore applied to the second back bias input 125 of the region 130. Hence, the logic state at output Q of the D flip-flop 101, which is set by the state select signal En, determines the first and second back bias voltages $V_{BP}$, $V_{BN}$ routed to the first and second back bias inputs 115, 113 of the region 130. The skilled person will appreciate that the select inputs C of MUX-P and MUX-N in other embodiments may be generated and supplied by the previously discussed global clock controller instead of the clock gating circuitry 110. The global clock controller may for example be configured to switch state of the select inputs C a certain number of clock periods ahead of the corresponding state switching of the state select signal En. The latter embodiment may be helpful to relax the drive current demands placed on the respective voltage follower(s) 122 coupled to MUX-P and MUX-N for driving the respective parasitic capacitances of the first and second back bias voltage grids.

The skilled person will understand that the level, or voltage, of the first back bias voltages $V_{BP}$ at the input 115 is switched between two different voltage levels when the first bias voltage supplied by the positive bias voltage generator VBP_GEN differs from the positive DC supply voltage $V_{DD}$. The state select signal En determines whether the first bias voltage or the positive DC supply voltage $V_{DD}$ is routed to the first back bias voltage grid of the logic portion 130 through the back bias input 115. The state select signal En likewise determines whether the second bias voltage or the negative DC supply voltage $V_{CC}$ is routed to the second back bias voltage grid of the logic circuit portion 130 through the back bias input 113. The first bias voltage supplied by the positive bias voltage generator VBP_GEN may be at least 100 mV, more preferably at least 200 mV, higher than the positive DC supply voltage $V_{DD}$. The second bias voltage supplied by the negative bias voltage generator VBN_GEN may be at least 100 mV, more preferably at least 200 mV, lower than the negative DC supply voltage $V_{CC}$. Consequently, if the positive DC supply voltage $V_{DD}$ is set to 0.6 volts, the first bias voltage may be set to 0.7 volts or higher for example 0.75 volt or 0.88 volt etc. If the negative DC supply voltage $V_{CC}$ is set to 0 V (ground potential), the second bias voltage may be set to −0.1 volt or lower for example −0.2 volt or −0.25 volt etc.

The overall operation of the logic circuit region 130, the associated clock gating circuitry 110 and the controllable back bias voltage generator 120 is explained by reference to the Clk, En and R-Clk signal waveform plots. The Clk waveform is continuously applied to the clock signal grid 102 and to the second input of the AND gate 103. When the state select signal En is low, the output of the AND gate 103 remains low and the regional clock signal R-Clk is interrupted or non-switching as illustrated on the inactive time segment of the R-Clk waveform before time t1. Hence, the logic circuit region 130 resides in an inactive state, or sleep mode, where the digital logic circuits are without clock signal. In this inactive state of the logic circuit region 130, the controllable back bias voltage generator 120 routes the first back bias voltage, which preferably is at least 100 mV higher than $V_{DD}$ as discussed above, to the first back bias input 115 to thereby increase the first back bias voltage of the PMOS transistors within the circuit region 130. In this inactive state of the logic circuit region 130, the controllable back bias voltage generator 120 furthermore routes the second back bias voltage, which preferably has a level at least 100 mV lower than $V_{CC}$ as discussed above, to the second back bias input 113 to thereby increase the second back bias voltage of the NMOS transistors within the circuit region 130. These increases of back bias voltages lead to reduction of the leakage currents through the PMOS and NMOS transistors, by raising their respective threshold voltages, during time periods where the logic circuit region 130 resides in the inactive state.

At time instant t1 the state select signal En switches to logic high and the output of the AND gate 103 in response starts switching, after a small delay for the rising clock edge of the Clk, synchronously with the continuously switching Clk signal. Consequently, the regional clock signal R-Clk is activated i.e. starts switching as illustrated on the active time segment of the R-Clk waveform after time t1 and approximately until time instant t2. Hence, the logic circuit region 130 now resides in an active state, or operational mode, where the digital logic circuits are clocked to perform their intended functions. In this active state of the logic circuit region 130, the controllable back bias voltage generator 120 routes the positive DC supply voltage $V_{DD}$ to the first back bias input 115 to set the first back bias voltage of the PMOS transistors within the logic circuit region 130 equal to $V_{DD}$. Hence, the first back bias voltage $V_{BP}$ rapidly drops from the first back bias voltage to the positive supply voltage $V_{DD}$ after time instant t1. Graph 150 shows the level of the first back bias voltage $V_{BP}$ on the same time scale as the above signal waveforms. The first back bias voltage is 0.2 V or 200 mV higher than $V_{DD}$. The controllable back bias voltage generator 120 furthermore routes the negative supply voltage $V_{CC}$, to the second back bias input 113 to set the second back bias voltage of the NMOS transistors within the logic circuit region 130 equal to $V_{CC}$. These reduced back bias voltages increase the respective leakage currents through the PMOS and NMOS transistors, by lowering their respective threshold voltages, during time periods where the logic circuit region 130 is active. However, this increase of leakage current in the active state of the region 130 will typically have a small impact on the total power consumption of the logic circuit region 130 because active switching power consumed by switching of the PMOS and NMOS transistors of the logic circuits exceeds by far the leakage power. Hence the lowering of the respective threshold voltages of the PMOS and NMOS transistors in the active state of the region 130 allow these to switch more rapidly, i.e. allowing a higher operational frequency of the digital logic circuits within the logic circuit region 130.

To determine potential power savings by introducing a variable back bias voltage scheme in clock gated logic circuit regions, the following facts and equations may be considered: Dynamic power consumption of the clock-gated logic circuit region considered is substantially identical with and without the adjustable back bias voltages of PMOS and NMOS transistors. Hence, it suffices to compute the leakage power in these two different cases, where:

The leakage power of a clock-gated non-back-biased logic circuit region is:

$$Pnb = I\_leak * A \ V_{DD};$$

Wherein:

l_leakA=the leakage of the logic circuit region in its active state;

$V_{DD}$=Positive DC supply voltage, e.g. 0.8 V, assuming the negative DC supply voltage is ground or zero Volt.

The leakage power of the clock-gated back-biased logic circuit region is:

$$Pb=(Ta*l\_leakA*V_{DD})+(Tp*l\_leakP*V_{DD})+ (fA*Cwell*dVbias*neta*V_{DD});$$

wherein:

The first term expresses leakage power in the active state of the logic circuit region, the second term expresses leakage power in the inactive state of the logic circuit region. The third term expresses power consumption incurred by adjusting the first and second back bias voltages between respective first and second levels;

Ta is time where the logic circuit region is in the active state;

Tp is the time where the logic circuit region is in the inactive state;

fA is the frequency of switching between active state and inactive state;

l_leakP is leakage power in the inactive state of the logic circuit region;

Cwell represents effective well region capacitance;

dVbias represents the voltage difference between the first and second voltage levels of the first and second back bias voltages;

neta is a efficiency factor of the power supply, e.g. a switched capacitor DC-DC voltage converter, used for generating the first and second back bias voltages;

Consequently, if Pb<Pnb then the dynamic adjustment of the first and second back bias voltages leads to power consumption savings.

This equation can also be expressed as:

$$D+(1-D)*l\_leakP/l\_leakA+ Ibias*fA*Cwell*dVbias*neta/IleakA<1$$

Where

D is the duty cycle, i.e. an average split over time, between the active state Ta and the inactive state Tp of the clock-gated back-biased logic circuit region:

$$D=Ta/(Ta+Tp).$$

The parameter D of the above equation can be found in various manners, e.g. by simulating a particular application utilising the digital logic circuits of the clock-gated logic circuit region and simulate how the timely split is between active and inactive states (D) and the frequency at which the clock-gated logic circuit region is switched, i.e. fA. The skilled person will appreciate that the leakage currents of the PMOS and NMOS transistors depend on semiconductor process parameters, transistor sizing, temperature and process deviations etc. In the above equations the estimation of the respective well capacitance has been simplified by considering a common capacitance of P-wells and N-wells.

The clock gating circuit 110 which may be pre-arranged on the integrated circuit for saving switching power within the logic circuit region 130 when the latter is inactive is utilized to additionally control the respective levels of the first back bias voltage and the second back bias voltage of the PMOS and NMOS transistors within the logic circuit region 130. By utilizing the state select signal En of the clock gating circuit 110, this beneficial reduction of leakage power is carried out by a minimal amount of additional circuitry of the clock gating circuit 110 for example merely the addition of the first multiplexer MUX-P and second multiplexer MUX-N, or equivalent circuit structures, and possibly the one or more cascaded drivers or buffers 122. A mentioned above, the positive bias voltage generator VBP_GEN and negative bias voltage generator VB_GEN may be shared amongst a plurality of logic circuit regions of the integrated circuit such that the circuit overhead imparted by these generators is minimal. On the other hand, the ability to significantly decrease of the leakage current of the digital logic circuitry within the logic circuit region 130 can save significant amounts of leakage power in the inactive state of the logic circuit region 130. The skilled person will appreciate that the saving of leakage power generally grows with the size, e.g. number of gates and flip-flops, within the logic circuit region 130.

FIGS. 2A and 2B show transistor layouts of the exemplary inverter circuit for arrangement within the previously discussed clock-gated logic circuit region 130 of the integrated circuit in three different fully depleted Silicon on Insulator (FD SOI) CMOS process technologies for comparison purposes. FIG. 2A shows three sagittal cut-through views through the semiconductor substrate of the exemplary inverter circuit in the different CMOS processes. FIG. 2B shows schematically the corresponding top view layouts of the exemplary inverter circuits of the integrated semiconductor circuit.

Section 200 of FIG. 2A shows the layout of the exemplary inverter circuit integrated in a so-called standard well FD SOI process. The inverter circuit or inverter comprises a PMOS transistor arranged in an N-well diffusion 21 of a P-polarity semiconductor substrate 20 and an NMOS transistor arranged in an P-Well diffusion or region 22. The-P-well diffusion or region 22 is arranged at least partly within the N-well diffusion. Finally, a deep N-well 21a diffusion if formed vertically below the P-well diffusion 22 abutting the N-well diffusion 21. The gate terminal 23 of the PMOS transistor and the gate terminal 23 of the NMOS transistor are electrically connected via a polysilicon gate layer 23 to form an input terminal of the inverter circuit as illustrated on FIG. 2B.The drain terminal 25 of the PMOS transistor and the drain terminal 25 of the NMOS transistor are electrically connected via a metal layer to form an output terminal of the inverter circuit as illustrated on FIG. 2B. Respective gate oxides are arranged below the gate terminals 23 of the PMOS transistor and NMOS transistor. Channel regions 26 are formed below the respective gate oxides of the PMOS transistor and NMOS transistor. The semiconductor substrate 20 additionally comprises an ultra-thin buried oxide layer 27 arranged below respective drain diffusions 25, source diffusions 24 and gate channels 26 of the NMOS and PMOS transistors. This ultra-thin buried oxide layer 27 insulates these diffusion regions from the P-substrate 20 and N-well and P-well diffusions and largely eliminates their parasitic capacitances to the substrate and wells leading to lower switching losses and higher switching speeds of the gate circuit. This ultra-thin buried oxide layer 27 also eliminates the electrical connections of the respective bodies of the NMOS transistor and PMOS transistor from the negative supply voltage $V_{CC}$ and the positive supply voltage $V_{DD}$ allowing significant adjustments of the respective body voltages to very effectively control the respective threshold voltages of the NMOS and PMOS transistors leading to the above discussed advantageous reduction of leakage power in the inactive state of the clock-gated logic circuit region 130. The PMOS transistor comprises a body terminal or connection 22' which is connected to the N-well 21. The body terminal or connection 22' which is connected to the previously discussed first back bias voltage grid of the region 130 for receipt of the first back bias voltage $V_{BP}$—for example through the first back bias input 115. As discussed above, the first back bias voltage $V_{BP}$ is supplied by the controllable back bias voltage generator 120. The NMOS transistor comprises a body terminal or connection 10 which is connected to the previously discussed second back bias voltage grid of the region 130 for receipt of the second back bias voltage $V_{BN}$—for example through the second back bias input 113. As discussed above, the second back bias voltage $V_{BN}$ is also supplied by the controllable back bias voltage generator 120.

Section 300 of FIG. 2A and FIG. 2B show transistor layouts of the exemplary inverter circuit integrated in a so-called flip-well FD SOI process. This inverter circuit implementation is described in detail below with reference to FIGS. 3A and 3B.

Section 400 of FIG. 2A and FIG. 2B shows the layout of two exemplary inverter circuits Inv1 and Inv2 integrated in a so-called mirrored flip-well FD SOI process. Each of the inverter circuits Inv1 and Inv2 comprises a PMOS transistor arranged in a P-well diffusion 42 within a surrounding N-well diffusion 41 and deep N-well diffusion 41a. The N-well diffusion 41 and deep N-well diffusion 41a are formed in a P-polarity semiconductor substrate 20. Each of the inverter circuits Inv1 and Inv2 furthermore comprises an NMOS transistor arranged in the N-well diffusion 41, but on opposite sides of the two PMOS transistors. The respective gate terminals 43a of the PMOS and NMOS transistors of the first inverter circuit Inv1 are electrically connected via a polysilicon gate layer 43a to form an input terminal of the first inverter circuit as best illustrated on FIG. 2B. Likewise, the gate terminals 43b of the PMOS and NMOS transistors of the second inverter circuit Inv2 are electrically connected via a polysilicon gate layer 43b to form an input terminal of the second inverter circuit as best illustrated on FIG. 2B. The drain terminals 45 of the PMOS transistor and the drain terminal 45 of the NMOS transistor of the first inverter circuit Inv1 are electrically connected via a metal layer to form an output terminal of the first inverter circuit and the corresponding connection is made of drain terminals of the second inverter circuit Inv2 to form an output terminal of the second inverter circuit as best illustrated on FIG. 2B. Respective gate oxides are arranged below the gate terminals 43 of the PMOS transistor and NMOS transistor. Channel regions 46 are formed below the respective gate oxides of the PMOS transistors and NMOS transistors of the first and second inverter circuits. The semiconductor substrate 20 comprises an ultra-thin buried oxide layer 47 arranged below respective drain diffusions 45, source diffusions 44 and gate channels 36 of the NMOS and PMOS transistors of the first and second inverter circuits. This ultra-thin buried oxide layer 47 insulates these diffusion regions from the P-well diffusion 42 and the N-well diffusion 41 and largely eliminates their parasitic capacitances to the wells and/or P-substrate 20 leading to lower switching losses and higher switching speeds of the gate circuit. This ultra-thin buried oxide layer 27 also eliminates the electrical connections of the respective bodies of the NMOS transistors and PMOS transistors of the first and second inverter circuits from the negative supply voltage $V_{CC}$ and the positive supply voltage $V_{DD}$ allowing significant adjustments of the respective body voltages to very effectively control the respective threshold voltages of the NMOS and PMOS transistors of the leading to the above discussed advantageous reduction of leakage power in the inactive state of the clock-gated logic circuit region 130.

The PMOS transistors share a body terminal or connection 42' which is connected to the shared P-well diffusion 42'. The body terminal or connection 42' is connected to the previously discussed first back bias voltage grid of the region 130 for receipt of the first back bias voltage $V_{BP}$—for example through the first back bias input 115. As discussed above, the first back bias voltage $V_{BP}$ is supplied by the controllable back bias voltage generator 120. The NMOS transistors comprise one or several body terminal(s) or connection(s) 10 which is/are connected to the shared N-well diffusion 41 and deep N-well diffusion 41a. The body terminal or connection 10 is connected to the previously discussed second back bias voltage grid of the logic region 130 for receipt of the second back bias voltage $V_{BN}$—for example through the second back bias input 113. As discussed above, the second back bias voltage $V_{BN}$ is also supplied by the controllable back bias voltage generator 120.

Figure 3B:
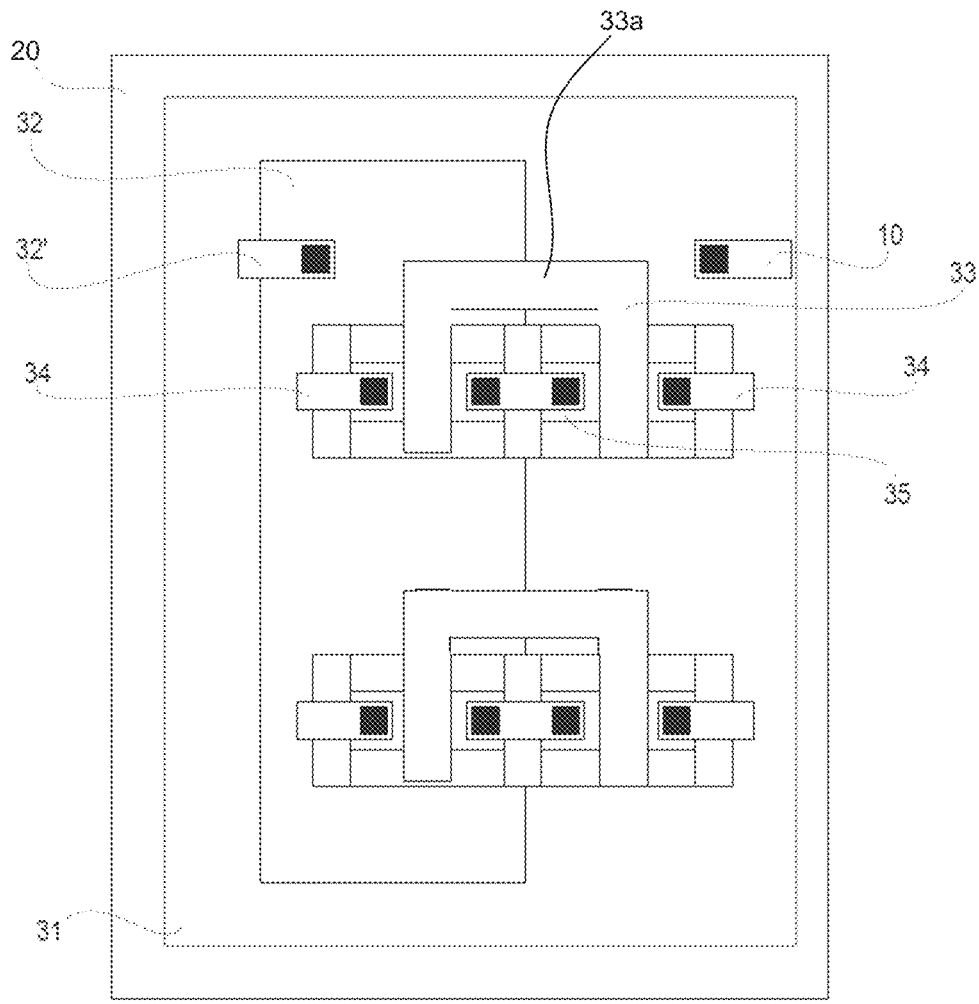

FIG. 3A and FIG. 3B show transistor layouts of the exemplary inverter circuit as integrated in the previously mentioned flip-well FD SOI process. The inverter circuit comprises a PMOS transistor arranged in a P-well diffusion 32 within a surrounding N-well diffusion 31 and deep N-well diffusion 31a. The N-well diffusion 31 and deep N-well diffusion 31a are formed in a P-polarity semiconductor substrate 20. The inverter circuit furthermore comprises an NMOS transistor arranged in the N-well diffusion 31. The respective gate terminals 33a of the PMOS and NMOS transistors of the inverter circuit are electrically connected via a polysilicon gate layer 33a to form an input terminal of the inverter circuit as best illustrated on FIG. 4B. The drain terminals 35 of the PMOS transistor and the drain terminal 35 of the NMOS transistor are electrically connected via a metal layer to form an output terminal of the inverter circuit as best illustrated on FIG. 4B. Respective gate oxides 36 are arranged below the gate terminals 33 of the PMOS transistor and NMOS transistor. Channel regions are formed below the respective gate oxides of the PMOS and NMOS transistor. The semiconductor substrate 20 comprises an ultra-thin buried oxide layer 37 arranged below respective drain diffusions 35, respective source diffusions 34 and respective gate channels of the NMOS and PMOS transistors. This ultra-thin buried oxide layer 37 insulates the source and drain diffusion regions from the P-well diffusion 32 and the N-well diffusion 31 and largely eliminates their parasitic capacitances to the respective wells and/or P-substrate 20 leading to lower switching losses and higher switching speeds of the gate circuit. This ultra-thin buried oxide layer 37 also eliminates the electrical connections of the respective bodies of the NMOS transistors and PMOS transistors of the inverter circuit from the negative supply voltage $V_{CC}$ and the positive supply voltage $V_{DD}$ allowing significant adjustments of the respective body voltages to very effectively control the respective threshold voltages of the NMOS and PMOS transistors of the leading to the above discussed advantageous reduction of leakage power in the inactive state of the clock-gated logic circuit region 130. The PMOS transistor comprises body terminal or connection 32' which is connected to the P-well diffusion 32. The body terminal or connection 32' is connected to the previously discussed first back bias voltage grid of the region 130 for receipt of the first back bias voltage $V_{BP}$—for example through the first back bias input 115. As discussed above, the first back bias voltage $V_{BP}$ is supplied by the controllable back bias voltage generator 120. The NMOS transistors comprise one or several body terminal(s) or connection(s) 10 which is/are connected to the N-well diffusion 31 and deep N-well diffusion 31a. The body terminal or connection 10 is connected to the previously discussed second back bias voltage grid of the logic region 130 for receipt of the second back bias voltage $V_{BN}$—for example through the second back bias input 113. As discussed above, the second back bias voltage $V_{BN}$ is also supplied by the controllable back bias voltage generator 120. The skilled person will understand that the second back bias voltage $V_{BN}$ preferably is maximally 300 mV, for example 100 mV or 200 mV, lower than the negative DC supply voltage (which is connected to the source terminal 34 of the NMOS transistor). This voltage difference will typically prevent any massive flow of leakage current from the body terminal 10 into the underlying P-substrate due to the creation of a forward biased diode junction.

Figure 4A:
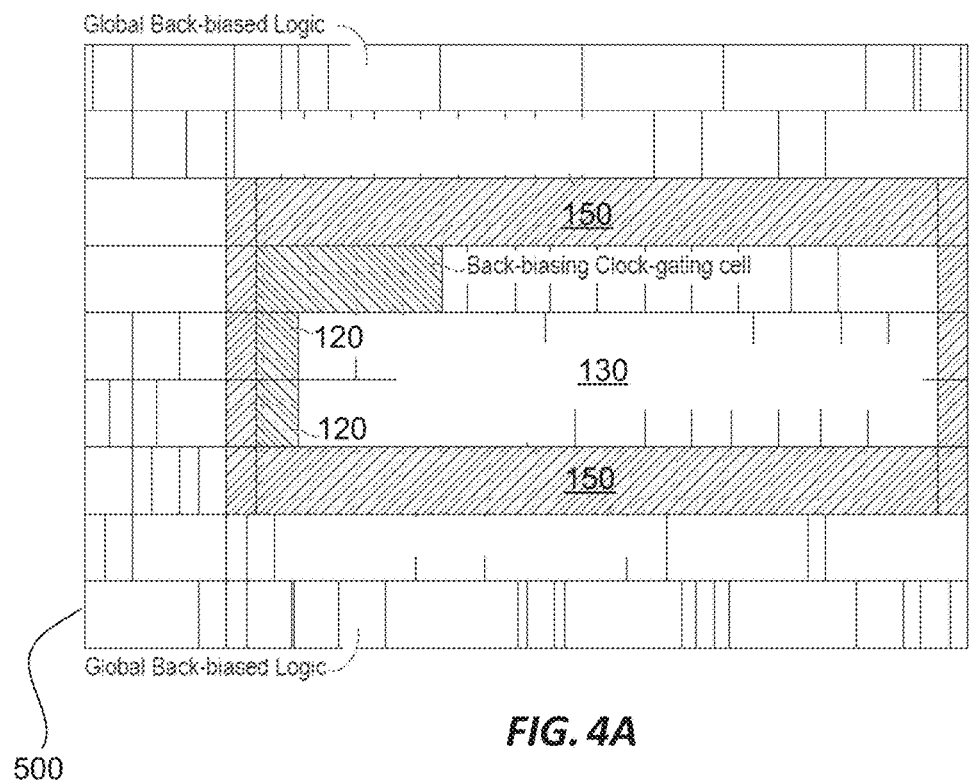
FIG. 4A and FIG. 4B show schematically top-view floorplans of the clock-gated logic circuit region on the integrated semiconductor circuit in the previously discussed flip-well FD SOI process according to two different embodiments.

FIG. 4A shows schematically an exemplary small cell area floorplan of the previously discussed clock-gated logic circuit region 130, associated clock gating circuitry 110 and a controllable back bias voltage generator 120 of the integrated semiconductor circuit 500 fabricated in the previously discussed flip-well FD SOI process. The controllable back bias voltage generator 120 of the illustrated small cell area floorplan utilizes a first back bias voltage for bodies of the PMOS transistors of the gated logic circuit region 130 and a second back bias voltage for bodies of the NMOS transistors of the gated logic circuit region 130. A plurality of well and substrate isolation cells 150 at least partly surround logic circuitry of the gated logic circuit region 130.

Figure 4B:
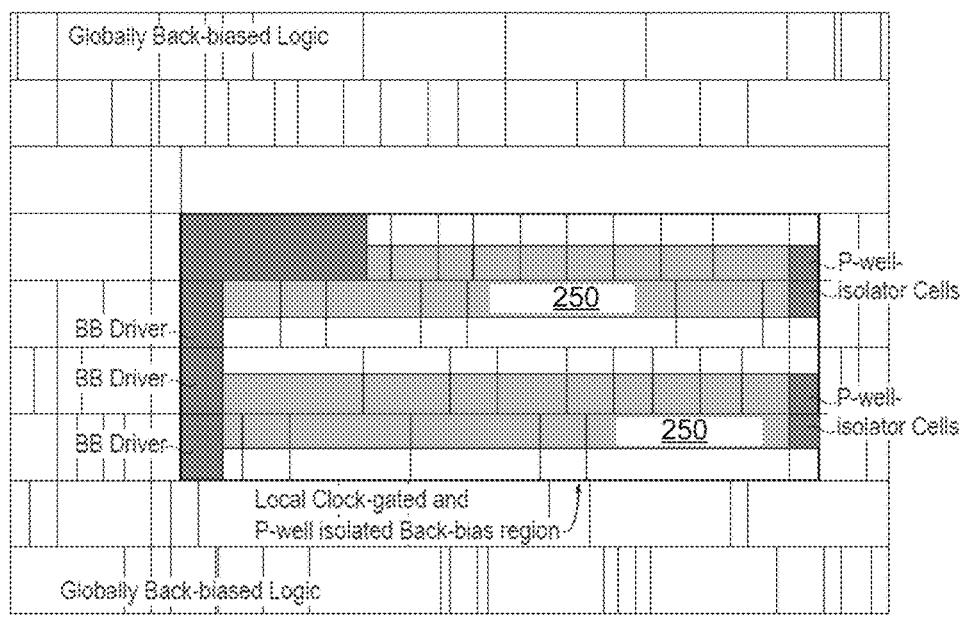

FIG. 4B shows schematically an exemplary small cell area floorplan of the previously discussed clock-gated logic circuit region 130, associated clock gating circuitry 110 and a controllable back bias voltage generator 120 on the integrated semiconductor circuit 500 fabricated in the previously discussed flip-well FD SOI process.

In this embodiment, the clock-gated logic circuit region 130 comprises a P-well isolated back-biasing region surrounded by globally back-biased logic areas. The controllable back bias voltage generator 120 of the illustrated small cell area floorplan utilizes only an adjustable back bias voltage for bodies of the PMOS transistors of the gated logic circuit region 130. This feature eliminates any need for full substrate isolation as the PMOS transistors are arranged in their own well diffusion or region 250 and therefore isolated from the substrate. The small cell area floorplan includes dedicated cells "P-well isolator Cells" which serve to electrically insulate the P-well region 250 from the remaining portion of the standard cell row.

The invention claimed is:
1. An integrated circuit comprising:
 a clock signal grid for providing a clock signal;
 a first logic circuit region, wherein the first logic circuit region comprises a first regional clock network for supplying a first regional clock signal to one or more digital logic circuits of the first logic circuit region;
 a clock gating circuit configured to determine the first regional clock signal based on the clock signal;
 a first back bias voltage grid connected to PMOS transistors of the one or more digital logic circuits;
 a second back bias voltage grid connected to NMOS transistors of the one or more digital logic circuits; and
 a controllable back bias voltage generator configured to (1) adjust a first back bias voltage of the first back bias voltage grid in accordance with a state select signal, and (2) adjust a second back bias voltage of the second back bias voltage grid in accordance with the state select signal;
 wherein the integrated circuit is arranged on a fully depleted Silicon on Insulator (FD SOI) substrate or a partially depleted Silicon on Insulator (PD SOI) substrate, wherein the fully or partially depleted Silicon on Insulator substrate comprises a flip-well structure, the flip-well structure comprising:
  a first plurality of wells comprising the NMOS transistors of the one or more digital logic circuits, the first plurality of wells being connected to the second back bias voltage grid for receipt of the second back bias voltage; and
  a second plurality of wells comprising the PMOS transistors of the one or more digital logic circuits, the second plurality of wells being connected to the first back bias voltage grid for receipt of the first back bias voltage.

2. The integrated circuit according to claim 1, wherein the one or more digital logic circuits comprise at least one sequential logic circuit connected to the first regional clock network for receipt of the first regional clock signal.

3. The integrated circuit according to claim 1, wherein the state select signal is for switching the first logic circuit region between an active state where the first regional clock signal is active, and an inactive state where the first regional clock signal is interrupted or non-switching.

4. The integrated circuit according to claim 3, wherein the controllable back bias voltage generator is configured to:
 in the active state: adjust the first bias voltage of the first back bias voltage grid to a positive DC supply voltage, and adjust the second bias voltage of the second back bias voltage grid to a negative DC supply voltage; and
 in the inactive state: adjust the first bias voltage of the first back bias voltage grid to a voltage above the positive DC supply voltage, and adjust the second bias voltage of the second back bias voltage grid to a voltage below the negative DC supply voltage.

5. The integrated circuit according to claim 1, wherein the controllable back bias voltage generator is configured to adjust the first back bias voltage between a first level and a second level.

6. The integrated circuit according to claim 5, wherein the controllable back bias voltage generator is configured to set a voltage difference between the first level and the second level of the first back bias voltage grid to be larger than 100 mV.

7. The integrated circuit according to claim 1, wherein the controllable back bias voltage generator is configured to adjust the second back bias voltage between a first level and a second level; and
 wherein the controllable back bias voltage generator is configured to set a voltage difference between the first level and the second level of the second back bias voltage grid larger than 100 mV.

8. The integrated circuit according to claim 1, wherein the controllable back bias voltage generator comprises:
 a first multiplexer configured to selectively provide the first back bias voltage and a positive DC supply voltage to the first back bias voltage grid in accordance with the state select signal; and
 a second multiplexer configured to selectively provide the second back bias voltage and a negative DC supply voltage to the second back bias voltage grid in accordance with the state select signal.

9. The integrated circuit according to claim 8, wherein the first multiplexer comprises: a first input for receiving the first back bias voltage, a second input for receiving the positive DC supply voltage, a select input for receiving the state select signal, and an output connected to the first back bias voltage grid; and
 wherein the second multiplexer comprises: a first input for receiving the second back bias voltage, a second input for receiving the negative DC supply voltage, a select input for receiving the state select signal, and an output connected to the second back bias voltage grid.

10. The integrated circuit according to claim 1, wherein the controllable back bias voltage generator comprises a switched mode DC-DC converter configured to generate at least one of the first back bias voltage and the second back bias voltage.

11. The integrated circuit according to claim 10, wherein the switched mode DC-DC converter comprises a switched capacitor converter.

12. The integrated circuit according to claim 1, wherein the clock gating circuit comprises a D-FF and an AND gate;
wherein the D-FF has a data input configured to receive the state select signal, a clock input configured to receive the clock signal, and an output connected to a first input of the AND gate; and
wherein a second input of the AND gate is configured to receive the clock signal, and an output of the AND gate is configured to provide the first regional clock signal to the first regional clock network.

13. The integrated circuit according to claim 1, wherein the first back bias voltage grid and the second back bias voltage grid are parts of the first logic circuit region.

14. A hearing instrument comprising:
a first audio input channel for receipt of a first audio signal;
a signal processor configured for processing the first audio signal to generate a compensated signal according to a hearing loss of a user;
an output amplifier for receipt of the compensated signal and generation of an amplified or buffered output signal for application to a receiver or loudspeaker of the hearing instrument; and
an integrated circuit comprising:
a clock signal grid for providing a clock signal;
a first logic circuit region, wherein the first logic circuit region comprises a first regional clock network for supplying a first regional clock signal to one or more digital logic circuits of the first logic circuit region;
a clock gating circuit configured to determine the first regional clock signal based on the clock signal;
a first back bias voltage grid connected to PMOS transistors of the one or more digital logic circuits;
a second back bias voltage grid connected to NMOS transistors of the one or more digital logic circuits; and
a controllable back bias voltage generator configured to (1) adjust a first back bias voltage of the first back bias voltage grid in accordance with a state select signal, and (2) adjust a second back bias voltage of the second back bias voltage grid in accordance with the state select signal.

15. The hearing instrument according to claim 14, wherein the one or more digital logic circuits comprise at least one sequential logic circuit connected to the first regional clock network for receipt of the first regional clock signal.

16. The hearing instrument according to claim 14, wherein the state select signal is for switching the first logic circuit region between an active state where the first regional clock signal is active, and an inactive state where the first regional clock signal is interrupted or non-switching.

17. The hearing instrument according to claim 16, wherein the controllable back bias voltage generator is configured to:

in the active state: adjust the first bias voltage of the first back bias voltage grid to a positive DC supply voltage, and adjust the second bias voltage of the second back bias voltage grid to a negative DC supply voltage; and
in the inactive state: adjust the first bias voltage of the first back bias voltage grid to a voltage above the positive DC supply voltage, and adjust the second bias voltage of the second back bias voltage grid to a voltage below the negative DC supply voltage.

18. The hearing instrument according to claim 14, wherein the controllable back bias voltage generator is configured to adjust the first back bias voltage between a first level and a second level.

19. The hearing instrument according to claim 18, wherein the controllable back bias voltage generator is configured to set a voltage difference between the first level and the second level of the first back bias voltage grid to be larger than 100 mV.

20. The hearing instrument according to claim 14, wherein the controllable back bias voltage generator is configured to adjust the second back bias voltage between a first level and a second level; and
wherein the controllable back bias voltage generator is configured to set a voltage difference between the first level and the second level of the second back bias voltage grid larger than 100 mV.

21. The hearing instrument according to claim 14, wherein the controllable back bias voltage generator comprises:
a first multiplexer configured to selectively provide the first back bias voltage and a positive DC supply voltage to the first back bias voltage grid in accordance with the state select signal; and
a second multiplexer configured to selectively provide the second back bias voltage and a negative DC supply voltage to the second back bias voltage grid in accordance with the state select signal.

22. The hearing instrument according to claim 21, wherein the first multiplexer comprises: a first input for receiving the first back bias voltage, a second input for receiving the positive DC supply voltage, a select input for receiving the state select signal, and an output connected to the first back bias voltage grid; and
wherein the second multiplexer comprises: a first input for receiving the second back bias voltage, a second input for receiving the negative DC supply voltage, a select input for receiving the state select signal, and an output connected to the second back bias voltage grid.

23. The hearing instrument according to claim 14, wherein the controllable back bias voltage generator comprises a switched mode DC-DC converter configured to generate at least one of the first back bias voltage and the second back bias voltage based on a positive DC supply voltage.

24. The hearing instrument according to claim 23, wherein the switched mode DC-DC converter comprises a switched capacitor converter.

25. The hearing instrument according to claim 14, wherein the clock gating circuit comprises a D-FF and an AND gate;
wherein the D-FF has a data input configured to receive the state select signal, a clock input configured to receive the clock signal, and an output connected to a first input of the AND gate; and
wherein a second input of the AND gate is configured to receive the clock signal, and an output of the AND gate is configured to provide the first regional clock signal to the first regional clock network.

26. The hearing instrument according to claim 14, wherein the integrated circuit is arranged on a fully depleted Silicon on Insulator (FD SOI) substrate or a partially depleted Silicon on Insulator (PD SOI) substrate.

27. The hearing instrument according to claim 26, wherein the fully or partially depleted Silicon on Insulator substrate comprises a well structure, the well structure comprising:
- a first plurality of wells comprising the PMOS transistors of the one or more digital logic circuits, the first plurality of wells that comprises the PMOS transistors being connected to the second back bias voltage grid for receipt of the second back bias voltage; and
- a second plurality of wells comprising the NMOS transistors of the one or more digital logic circuits, the second plurality of wells that comprises the NMOS transistors being connected to the first back bias voltage grid for receipt of the first back bias voltage.

28. The hearing instrument according to claim 14, wherein the fully or partially depleted Silicon on Insulator substrate comprises a flip-well structure, the flip-well structure comprising:
- a first plurality of wells comprising the NMOS transistors of the one or more digital logic circuits, the first plurality of wells being connected to the second back bias voltage grid for receipt of the second back bias voltage; and
- a second plurality of wells comprising the PMOS transistors of the one or more digital logic circuits, the second plurality of wells being connected to the first back bias voltage grid for receipt of the first back bias voltage.

29. The hearing instrument according to claim 14, further comprising a bulk CMOS substrate comprising a double-well structure, the double-well structure comprising:
- a first plurality of wells comprising the NMOS transistors of the one or more digital logic circuits, the first plurality of wells being connected to the second back bias voltage grid for receipt of the second back bias voltage; and
- a second plurality of wells comprising the PMOS transistors of the one or more digital logic circuits, the second plurality of wells being connected to the first back bias voltage grid for receipt of the first back bias voltage.

30. The hearing instrument according to claim 14, wherein the first back bias voltage grid and the second back bias voltage grid are parts of the first logic circuit region.

* * * * *